(12) United States Patent
Manipatruni et al.

(10) Patent No.: US 11,411,046 B2
(45) Date of Patent: Aug. 9, 2022

(54) SEMICONDUCTOR DEVICE HEAT EXTRACTION BY SPIN THERMOELECTRICS

(71) Applicant: Intel Corporation, Santa Clara, CA (US)

(72) Inventors: Sasikanth Manipatruni, Portland, OR (US); Tanay Gosavi, Hillsboro, OR (US); Dmitri Nikonov, Beaverton, OR (US); Ian Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 821 days.

(21) Appl. No.: 16/128,278

(22) Filed: Sep. 11, 2018

(65) Prior Publication Data
US 2020/0083284 A1    Mar. 12, 2020

(51) Int. Cl.

| | |
|---|---|
| *H01L 27/16* | (2006.01) |
| *H01L 37/00* | (2006.01) |
| *H01L 25/16* | (2006.01) |
| *H01L 35/32* | (2006.01) |
| *H01L 35/30* | (2006.01) |
| *H01L 29/417* | (2006.01) |
| *H01L 29/06* | (2006.01) |

(52) U.S. Cl.
CPC ............. *H01L 27/16* (2013.01); *H01L 25/16* (2013.01); *H01L 35/30* (2013.01); *H01L 35/32* (2013.01); *H01L 37/00* (2013.01); *H01L 29/0657* (2013.01); *H01L 29/41783* (2013.01)

(58) Field of Classification Search
CPC ....... H01L 37/00; H01L 37/02; H01L 37/025; H01L 37/04; H01L 27/16; H01L 23/3737
See application file for complete search history.

(56) References Cited

U.S. PATENT DOCUMENTS

| | | | |
|---|---|---|---|
| 2013/0104948 A1* | 5/2013 | Saitoh ................. | H01L 35/32 136/200 |
| 2014/0230873 A1* | 8/2014 | Kirihara .............. | H01L 37/04 136/205 |
| 2015/0303363 A1* | 10/2015 | Kirihara .............. | H01L 37/04 136/201 |

(Continued)

FOREIGN PATENT DOCUMENTS

| | | | | |
|---|---|---|---|---|
| WO | WO-2013047254 A1 * | 4/2013 | ............. | H01L 37/00 |
| WO | WO-2014087749 A1 * | 6/2014 | ............. | H01F 10/20 |
| WO | WO-2018146713 A1 * | 8/2018 | ............. | H01L 29/82 |

*Primary Examiner* — Brigitte A Paterson
(74) *Attorney, Agent, or Firm* — Essential Patents Group, LLP

(57) ABSTRACT

Electrical devices with an integral thermoelectric generator comprising a spin-Seebeck insulator and a spin orbit coupling material, and associated methods of fabrication. A spin-Seebeck thermoelectric material stack may be integrated into macroscale power cabling as well as nanoscale device structures. The resulting structures are to leverage the spin-Seebeck effect (SSE), in which magnons may transport heat from a source (an active device or passive interconnect) and through the spin-Seebeck insulator, which develops a resulting spin voltage. The SOC material is to further convert the spin voltage into an electric voltage to complete the thermoelectric generation process. The resulting electric voltage may then be coupled into an electric circuit.

10 Claims, 11 Drawing Sheets

(56) References Cited

U.S. PATENT DOCUMENTS

| | | | |
|---|---|---|---|
| 2016/0133818 A1* | 5/2016 | Noh | H01L 37/00 |
| | | | 136/205 |
| 2016/0169988 A1* | 6/2016 | Sirringhaus | H01L 43/10 |
| | | | 324/251 |
| 2020/0194651 A1* | 6/2020 | Iwasaki | H01L 35/32 |
| 2020/0273864 A1 | 8/2020 | Manipatruni et al. | |
| 2020/0273866 A1 | 8/2020 | Manipatruni et al. | |
| 2020/0273867 A1 | 8/2020 | Manipatruni et al. | |
| 2020/0303343 A1 | 9/2020 | Manipatruni et al. | |
| 2020/0303344 A1 | 9/2020 | Manipatruni et al. | |
| 2020/0321344 A1 | 10/2020 | Ramamoorthy et al. | |
| 2020/0321472 A1 | 10/2020 | Ramamoorthy et al. | |
| 2020/0321473 A1 | 10/2020 | Ramamoorthy et al. | |
| 2020/0321474 A1 | 10/2020 | Ramamoorthy et al. | |
| 2021/0202507 A1 | 7/2021 | Thareja et al. | |
| 2021/0202510 A1 | 7/2021 | Thareja et al. | |
| 2021/0202689 A1 | 7/2021 | Thareja et al. | |
| 2021/0202690 A1 | 7/2021 | Thareja et al. | |
| 2021/0203324 A1 | 7/2021 | Manipatruni et al. | |
| 2021/0203325 A1 | 7/2021 | Manipatruni et al. | |
| 2021/0203326 A1 | 7/2021 | Manipatruni et al. | |
| 2021/0226636 A1 | 7/2021 | Manipatruni et al. | |

\* cited by examiner

SEMICONDUCTOR DEVICE HEAT EXTRACTION BY SPIN THERMOELECTRICS

BACKGROUND

With the advent of nanoscale electronics, microelectronic devices are capable of reaching unprecedented power densities. Although IC chip power reductions have been achieved, device scaling is multifaceted and may outpace power reductions as devices approach a limit on subthreshold swing (e.g., 60 mV/dec at 300 K). For example, not only has the footprint of given logic cell been reduced within an integrated circuit (IC), 3D ICs under development will further increase IC power dissipation/volume. Power dissipation is attributable to various resistances of active devices as well as electrical interconnects. While many architectures have been devised to conduct or radiate heat away from an IC chip, few of them address device-level heat extraction, and those that do, have significant overhead, which is counter to maximizing operative device density. For example, thermal vias and similar dummy structures embedded in close proximity to active devices occupy space that would otherwise be occupied by other active devices. Furthermore, because materials with good thermal conductivity generally also have good electrical conductivity, active devices need to be electrically isolated from heat conduits. The materials typically used for electrical isolation (insulation), such as silicon dioxide, silicon nitride, and the like, are relatively poor thermal conductors.

With power dissipation converting useful electrical power into waste heat, in addition to the difficulty in avoiding thermal runaway during device operation, device efficiency is lost. Architectures and techniques to extract heat and/or recoup such power losses are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
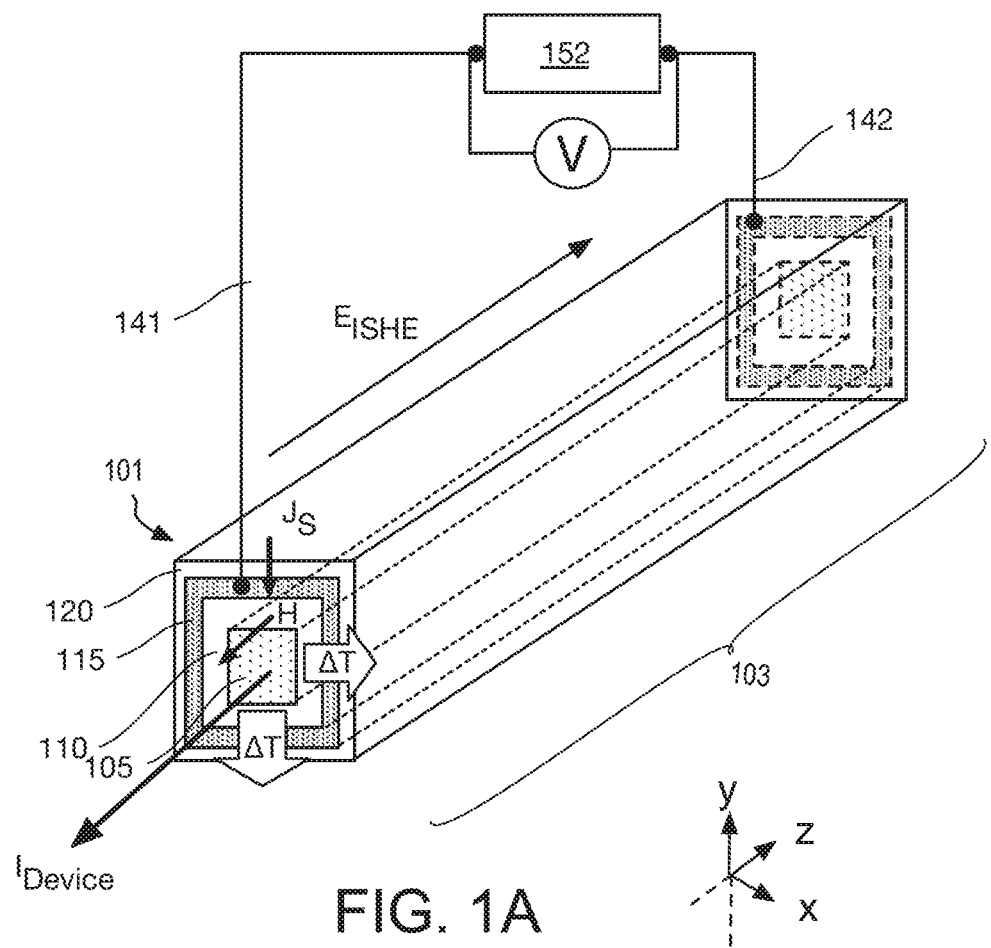
FIG. 1A is an isometric illustration of a power connector structure including an integral thermoelectric generator comprising a spin-Seebeck insulator and a spin orbit coupling material, in accordance with some embodiments.

Electrical devices with an integral thermoelectric generator comprising a spin-Seebeck insulator and a spin orbit coupling material, and associated methods of fabrication, are described herein. In the following description, numerous specific details are set forth, such as exemplary device architectures, to provide a thorough understanding of embodiments of the present disclosure. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Certain terminology may also be used in the following description for the purpose of reference only, and thus are not intended to be limiting. For example, terms such as "top," "bottom," "upper", "lower", "over," "above", "under," and "below" refer to directions in the drawings to which reference is made. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import. The terms "over," "under," "between," and "on" may also be used herein to refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, a spin-Seebeck thermoelectric material stack, comprising both a spin-Seebeck insulator and a spin orbit coupling (SOC) material, is integrated into macroscale power cabling, and may also be integrated into nanoscale device structures. Such structures are to leverage the spin-Seebeck effect (SSE), in which magnons may transport heat from a source (e.g., an active device or passive interconnect) and through the spin-Seebeck insulator, which develops a resulting spin voltage. The SOC material is to further convert the spin voltage into an electric voltage to complete the thermoelectric generation process. The resulting electric voltage, which generally scales with surface area of the spin-Seebeck material stack, may then be coupled into an electric circuit, for example as a voltage source. Because the spin-Seebeck insulator is also a good electrical insulator (i.e., few conduction electrons), the spin-Seebeck insulator may also provide electrical isolation of an active device or passive interconnect. Introduction of the spin-Seebeck insulator may therefore replace, at least in part, a conventional dielectric material, such as silicon dioxide or silicon nitride, that is not capable of heat extraction through the magnon mechanism. Integration of the spin-Seebeck thermoelectric material stack may therefore incur minimal overhead to the footprint of an active device or passive interconnect.

As shown in FIG. 1A, an electrically conductive interconnect structure 101 includes an electrical conductor 105, which may be any suitable wire or trace depending on the scale of interconnect 101. Conductor 105 is to conduct an electric device current $I_{device}$ in an axial direction. In some embodiments where interconnect structure 101 is a power cable, electrical conductor 105 comprises a wire that is to be coupled at one end to a power rail of a device power supply, battery, or to a mains power line, and coupled at the other end to a power sink such as, but not limited to, an electric motor, computer platform, or another battery (e.g., during a charging phase).

Adjacent to electrical conductor 105 is a spin-Seebeck insulator 110. Spin-Seebeck insulator 110 is a magnetic material capable of developing a spin voltage driving a spin current in the presence of a radial temperature gradient ΔT. The temperature gradient ΔT (T+ΔT at the interface with conductor 105 and T at the interface of a SOC material 115) may develop as a result of Joule heating of electrical conductor 105, for example. Insulator 110 is an electrical insulator lacking significant conduction electrons, but has a remanent magnetization field H, which is also in the axial direction. SOC material 115 is in contact with spin-Seebeck insulator 110, and may be any non-magnetic or paramagnetic metal capable of spin orbit coupling. Through the inverse spin-Hall effect (ISHE), a large spin polarized current can be developed within SOC material 115 in response to the spin signal within insulator 110. In the example shown in FIG. 1A, spin current spatial direction $J_s$ is radial, in a direction opposite ΔT (i.e., toward higher temperature, or toward conductor 105). The ISHE electric field $E_{ISHE}$ is then also axial. The ISHE thereby converts thermal energy into an electrical voltage V. Surrounding SOC material 115 is a cladding of a dielectric material 120 that is to insulate SOC material 115. A pair of terminals 141 and 142 coupled to SOC material 115 at opposite ends of interconnect structure 101 may couple interconnect structure 101 as a voltage source V into an electrical load circuit 152. As such, some fraction of waste heat from electrical conductor 105 may be converted into electrical energy, improving efficiency of interconnect structure 101 relative to a conventional power cable, IC interconnect, etc. Furthermore, with some fraction of heat generated by electrical conductor 105 extracted from the system through the insulator 110 in this manner, T+ΔT may be reduced relative to what can be achieved through phonon-based thermal conduction mechanisms.

Spin-Seebeck insulator 110 is a magnetic material (e.g., ferromagnetic or ferromagnetic) having a Curie temperature above a maximum operating temperature (e.g., Curie temperature above T+ΔT) of the device integrated therewith. In some embodiments, spin-Seebeck insulator 110 is a crystalline material (single crystal, polycrystalline, nanocrystalline). Crystal orientation (or texture of polycrystalline material) may vary with implementation and material choice. In some crystalline embodiments, for example where insulator 110 is laminated (e.g., rolled) on conductor 105, the crystal orientation, or texture, may be radial, for example with a same (e.g., (111)) plane at an interface with SOC material 115. In other crystalline embodiments, for example where insulator 110 is fabricated from a contiguous block of material, the crystal orientation, or texture, may be same over the entire volume of insulator 110, for example with different (111) planes interfacing with SOC material 115.

In some other embodiments, spin-Seebeck insulator 110 is an amorphous material lacking significant long range order. Although remanent magnetization fields may be strongest with crystalline embodiments, amorphous materials have also shown properties suitable for leveraging the spin-Seebeck effect in the manner described above. For such amorphous embodiments, insulator 110 may be deposited by physical vapor deposition (PVD), or any other non-epitaxial process known to be suitable for the chosen insulator material.

In some exemplary embodiments, insulator 110 is a transition metal oxide. In some such embodiments, insulator 110 is an iron oxide, such as, but not limited to, $F_2O_3$ or $Fe_3O_4$.

In some further embodiments, insulator 110 further includes silicon (e.g., garnet). Insulator 110 may further comprise one or more rare-earth dopants (e.g., Y or elements from the lanthanide series, such as Th, Sr, La). Hence, in addition to $F_2O_3$ and $Fe_3O_4$, some specific examples of suitable insulator materials include yttrium-iron garnet (YIG), thulium-iron garnet (ThIG), LaSrFeMnO, and LaYFeO. The thickness of insulator 110, as measured normal from the interface with conductor 105, may vary with implementation. In some embodiments, insulator 110 has a thickness of a few microns (e.g., 1-4 µm). In other embodiments, insulator 110 has a thickness of tens of microns (10-30 µm), or more. At such thicknesses, insulator 110 may have sufficient flexibility to be rolled around conductor 105 during manufacture, and/or permit interconnect structure 101 to bend, for example to a millimeter bend radius.

SOC material 115 may be a metal such as, but not limited to, tantalum (e.g., β-Tantalum), tungsten (e.g., β-Tungsten), platinum, gadolinium, or copper doped with elements such as iridium, bismuth and any of the elements of 3d, 4d, 5d and 4f, 5f periodic groups of the Periodic Table that, when alloyed, exhibit significant spin orbit coupling. SOC material 115 may also comprise a 2D semiconductor material, such as, but not limited to $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. The thickness of SOC material 115, as measured normal from the interface with insulator 110, may vary with implementation. In some embodiments SOC material 115 has a thickness below 50 nanometers (e.g., 4-20 nm).

Dielectric material 120 may vary from polymer coatings (e.g., a thermoplastic elastomer) for power cable embodiments to silicon dioxide, silicon nitride, or any low-k material known to be suitable for IC isolation dielectrics. The thickness of dielectric material 120, as measured normal from the interface with SOC material 115, may vary with implementation. For power cable embodiments, dielectric material 120 may have millimeter thickness. For IC interconnect embodiments, dielectric material 120 may have a thickness of tens of nanometers to tens of microns, for example.

Figures 1B, 1C:
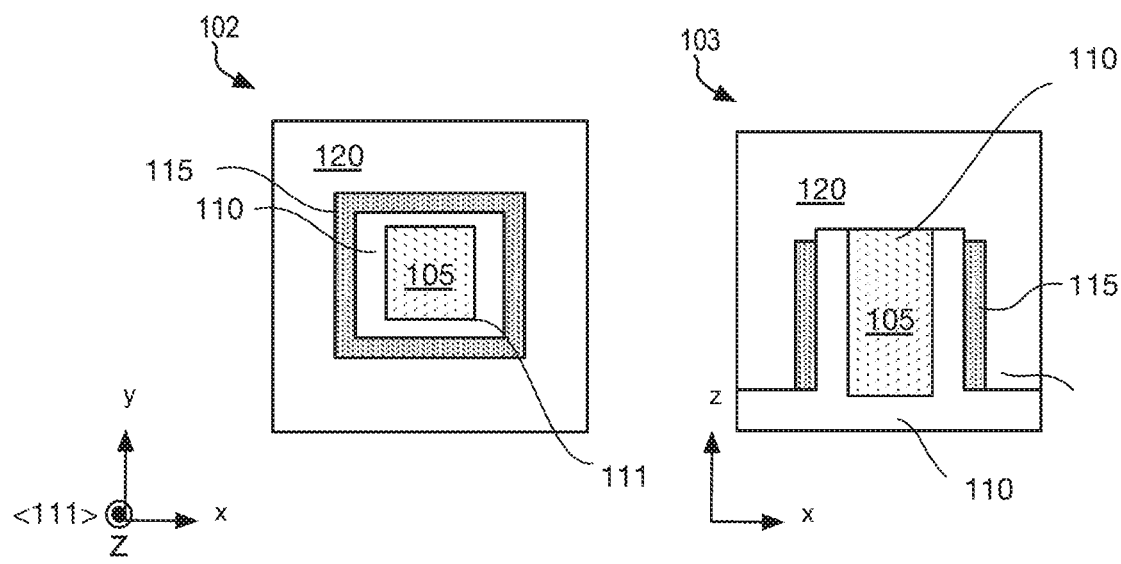
FIG. 1B is a plan view of a power connector structure including an integral thermoelectric generator comprising a spin-Seebeck insulator and a spin orbit coupling material, in accordance with some embodiments.
FIG. 1C is a cross-sectional profile of an interconnect within an IC, the interconnect including an integral thermoelectric generator comprising a spin-Seebeck insulator and a spin orbit coupling material, in accordance with some embodiments.

FIG. 1B is a plan view of a power connector structure 102 including an integral thermoelectric generator comprising a spin-Seebeck insulator and a spin coupling material, in accordance with some embodiments. In this example, the same reference numbers are employed for structural features having the same properties introduced above. In FIG. 1B, the axial length of connector structure 102 is through a thickness of insulator 110. Insulator 110 may have a specific crystal orientation relative to the axial length of connector structure 102. In one example, a (111) plane of insulator 110 is orthogonal to the z-dimension, with a contiguous block of insulator 110 surrounding four sides of conductor 105. Notably, not all sides of a conductor need be surrounded by a spin-Seebeck material stack. FIG. 1C is a cross-sectional profile of a power connector structure 103 where the same reference numbers are again employed for structural features having the properties introduced above. For connector structure 103, spin-Seebeck insulator 110 only surrounds a portion of conductor 105, with conductor 105 residing between two of fins patterned into spin-Seebeck insulator 110. SOC material 115 is in contact with exterior sidewalls of the insulator fins, and in contact with dielectric material 120 that is over one otherwise free surface of conductor 105. Dielectric material 120 is also over an exterior sidewall of SOC material 115. In the specific example illustrated, SOC material 115 is absent from a bottom surface of insulator 110, but in some further embodiments SOC material 115 may also be in contact with the bottom surface of insulator 110. In the exemplary structure shown in FIG. 1C, crystal orientation may such that a (111) plane is aligned approximately orthogonal to the z-axis with the axial length of connector structure 103 in the y-dimension. Connector structure 103 may again be any dimension, for example with insulator 110 having sidewalls of a millimeter, or more, for discrete power cable embodiments. Alternatively, for IC power routing embodiments, insulator 110 may have sidewalls of less than 100 µm (e.g., 50-75 µm).

Figure 2A:
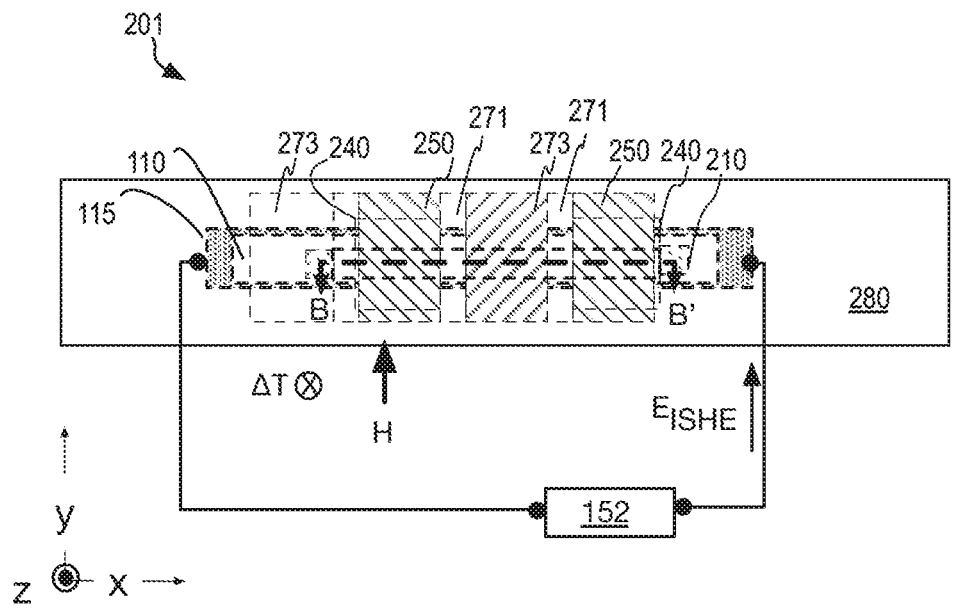
FIG. 2A is a plan view of a finFET structure comprising an integral thermoelectric generator comprising a spin-Seebeck insulator and a spin orbit coupling material, in accordance with some embodiments.
Figure 2B:
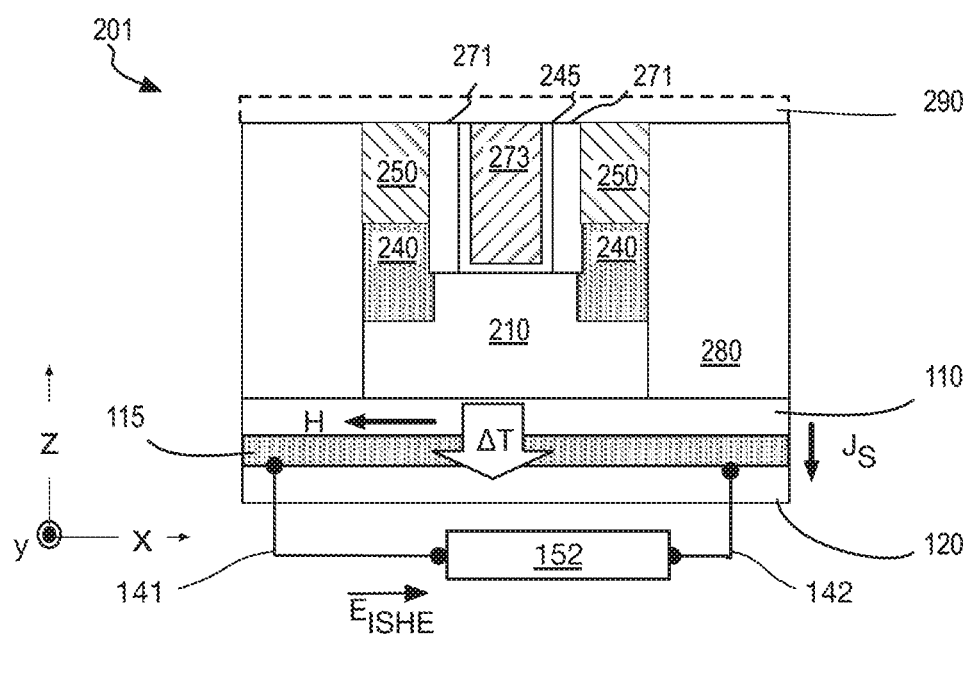
FIG. 2B is a cross-sectional profile of the finFET structure along the B-B' line illustrated in FIG. 2A, in accordance with some embodiments.

In some embodiments, a spin-Seebeck material stack is integrated within a transistor structure. Heat generated during operation of the transistor may be extracted by the spin-Seebeck material stack substantially as described above in the context of power connector structure 101. FIG. 2A is a plan view of a finFET structure 201 with an integral thermoelectric generator comprising spin-Seebeck insulator 110 and a SOC material 115, in accordance with some embodiments. FIG. 2B is a cross-sectional profile of finFET structure 201 along the B-B' line illustrated in FIG. 2A, in accordance with some further embodiments. FinFET structure 201 includes a source terminal, a drain terminal, and a gate terminal. In some embodiments, the source and drain terminals include a semiconductor material having the same conductivity type. In other embodiments, the source and drain terminals include a semiconductor material having complementary conductivity type (i.e., a tunnel FET, or TFET). FinFET structure 201 may also include a heterojunction (i.e., HFET), and may also qualify as a high electron mobility transistor (HEMT) when the channel comprises a III-V or III-N material. In FIG. 2A, solid lines within finFET structure 201 denote salient materials overlying other material or structural features denoted in dashed lines within a transistor stratum of an IC.

FinFET structure 201 includes a semiconductor body 210 that is embedded within a dielectric material 280. A gate electrode 273 straps across a channel region of semiconductor body 210. Although one semiconductor body 210 is illustrated in FIG. 2A, a non-planar FET may also include two or more such semiconductor bodies. Semiconductor body 210 may include one or more semiconductor region having any composition known to be suitable for a field effect transistor. Exemplary materials include, but are not limited to, group IV semiconductors (e.g., Si, Ge, SiGe), group III-V semiconductors (e.g., GaAs, InGaAs, InAs, InP), group III-N semiconductors (e.g., GaN, AlGaN, InGaN), oxide semiconductors, TMDCs, graphene, etc. In some advantageous embodiments, semiconductor body 210 is monocrystalline.

As further illustrated in FIG. 2A, source/drain metallization 250 is adjacent to gate electrode 273 and also extends across semiconductor body 210. In the illustrated embodiment, source/drain metallization 250 is on regrown or raised source/drain semiconductor 240, which is further in contact with semiconductor body 210. Source/drain semiconductor 240 may be any semiconductor material compatible with semiconductor body 210, such as, but not limited to, group IV semiconductors (e.g., Si, Ge, SiGe), and/or group III-V semiconductors (e.g., InGaAs, InAs), and/or group III-N semiconductors (e.g., InGaN), and/or (metal) oxide semiconductors. Source/drain semiconductor 240 may be doped with electrically active impurities imparting n-type or p-type conductivity. For some exemplary embodiments, both the source and drain semiconductor 240 is doped to the same conductivity type (e.g., n-type for NMOS and p-type for PMOS). In alternative embodiments (e.g., for a tunneling FET), source and drain semiconductor 240 is doped to have complementary conductivity (e.g., n-type source and p-type drain).

An electrically insulating spacer dielectric 271 laterally separates gate electrode 273 from source and drain metallization 250 and/or source and drain semiconductor 240. Source and drain metallization 250 may include one or more metals (e.g., Ti, W, Pt, their alloys, and nitrides) that form an ohmic or tunneling junction with doped source/drain semiconductor 240. Spacer dielectric 271 may be any dielectric such as, but not limited to, silicon dioxide, silicon nitride, or silicon oxynitride, or any known low-k material having a relative permittivity below 4.0. Although only one gate electrode 273 is illustrated in solid line as being part of a single logic transistor structure, an exemplary second gate electrode 273 is drawn in dashed line as being associated with an adjacent transistor structure. The second gate electrode is also laterally separated from metallization 250 and/or source/drain semiconductor 240 by spacer dielectric 271.

As shown in FIG. 2A, transistor structure 205 further includes a spin-Seebeck material stack comprising spin-Seebeck insulator 110 below semiconductor body 210, and SOC material 115 below spin-Seebeck insulator 110. Insulator 110 therefore electrically isolates semiconductor body 210 from SOC material 115. A voltage potential developed by SOC material 115 is to be coupled to a load circuit 152, which may be integrated into a same IC as transistor structure 205, or which may be external of the IC that comprises transistor structure 205.

As shown in FIG. 2B, a gate dielectric 245 separates gate electrode 273 from semiconductor body 210. Gate dielectric 245 may be any known dielectric material, such as, but not limited to, silicon oxides (SiO), silicon nitrides (SiN), silicon oxynitrides (SiON), silicon carbonitrides (SiCN), or any high-k material having a relative permittivity greater than that of silicon nitride (e.g., such as HfO$_2$, metal silicate, or the like). Insulator 110 is in contact with a bottom surface of semiconductor body 210. Insulator 110 is on a side opposite a front-side stack 290 that is over the front-side, or top, transistor surface. Front-side stack 290 is illustrated in dashed line as being a portion of a transistor stratum that may vary without limitation and may, for example, include any number of backend interconnect metallization levels.

Such levels may be separated from semiconductor bodies 210 and/or from each other by one or more inter-level dielectric (ILD) layer. Although only one semiconductor body 210 is illustrated, it is noted that insulator 110 may be in contact with any number of such semiconductor bodies. Advantageously, insulator 110 is at least in contact with a portion of a semiconductor body proximal to a channel region of transistor structure 201. As further shown in FIG. 2B, heat generated during operation of transistor structure 201 results in a ΔT where the temperature is T+ΔT at the interface between insulator 110 and semiconductor body 110, and the temperature is T at the interface between insulator 110 and SOC material 115. In this example, insulator 110 has an in-plane (x-y) magnetic field H and SOC material 115 has a spin current direction $J_s$ in the z-dimension. In some such embodiments, insulator 110 may have a thickness (z-dimension) on the order of semiconductor body 210 (e.g., 20-100 nm). SOC material 115 may have a thickness in the 2-20 nm range, for example.

Fabrication of transistor structure 205 may be according to a variety of methods and techniques. In some embodiments, semiconductor body 210 is a feature that has been patterned into a device layer of a semiconductor on insulator (SOI) substrate in which spin-Seebeck insulator 110 serves as the insulator layer (rather than the typical silicon dioxide). Insulator 110 of an SOI substrate may be crystalline (e.g., a single crystal). Such an SOI substrate may be fabricated, for example, through layer transfer and/or wafer-level bonding techniques where both insulator 110 and a semiconductor device layer are transferred onto any suitable handling substrate. In some such embodiments the semiconductor device layer of an SOI substrate has a first crystal orientation, for example (100 along z-axis), which may be optimal for many transistors, while insulator 110 has a second orientation (e.g., 111 along z-axis), which may be optimal for leveraging the spin-Seebeck effect. In some further embodiments, spin coupling layer 115 is also prefabricated within the SOI substrate. Terminals 141 and 142 may then be fabricated through dielectric 120 during backside processing.

Alternatively, subsequent to any number of front-side fabrication processes and/or bonding to a front-side handle substrate, the backside of insulator 210 may be exposed, for example through a chemical mechanical polishing (CMP) of a back-side handling substrate (not depicted). Spin coupling layer 115 may then be deposited and patterned on the exposed material surface. Dielectric 120 may then be deposited, and terminals 141, 142 fabricated during subsequent back-side processing.

In still other embodiments, fabrication of an SOI substrate may entail deposition of an amorphous insulator 110 and a semiconductor device layer is transferred (e.g., bonded) onto insulator 110 according to any technique suitable. In other embodiments that need not employ an SOI substrate, a back side of semiconductor body 210 may be revealed, for example by local or global (i.e., wafer-level) substrate thinning. An amorphous insulator 110 may then be deposited upon the bottom surface of semiconductor 210 during subsequent back-side wafer processing. These various techniques may all result in a device structure similar to that illustrated in FIG. 2A and FIG. 2B.

Figure 2C:
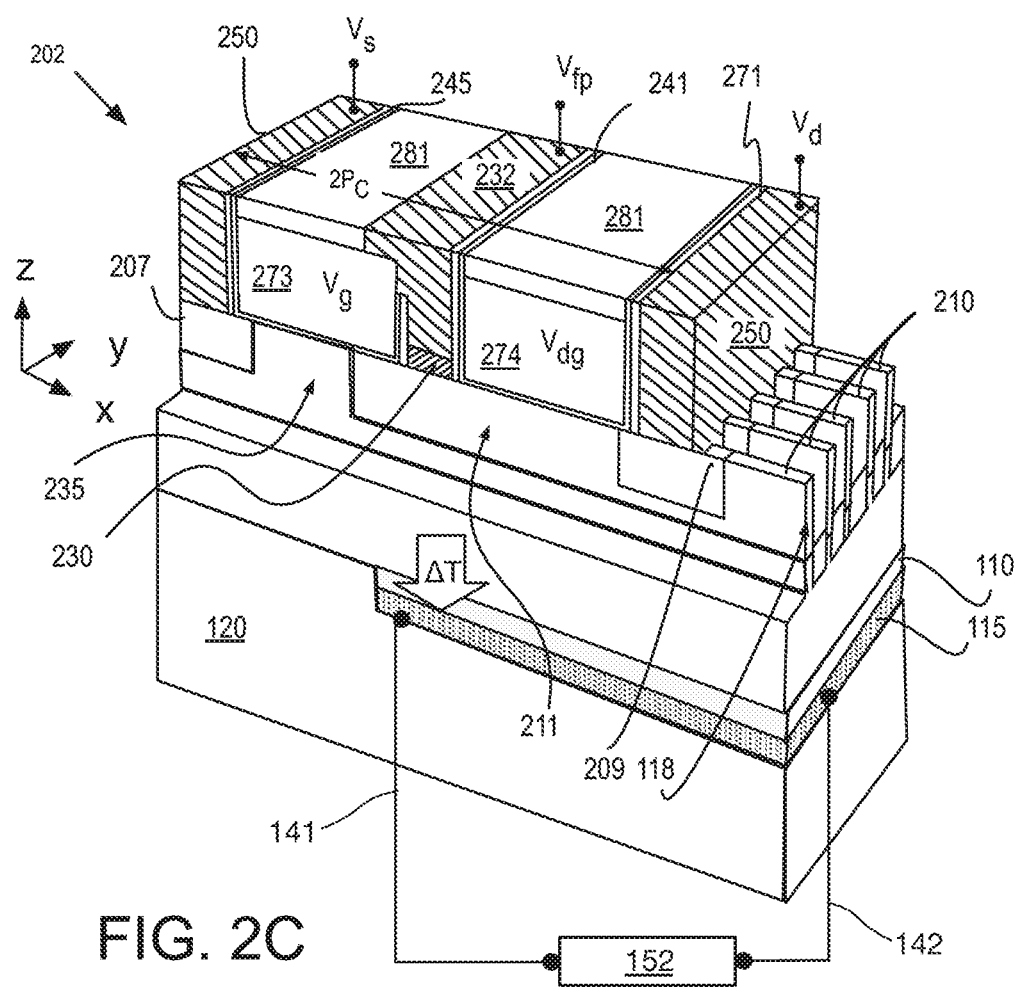
FIG. 2C is an isometric view of a multi-finned power transistor and an integral thermoelectric generator comprising a spin-Seebeck insulator and a spin orbit coupling material proximal to an extended drain of the transistor, in accordance with some embodiments.

While transistor structure 205 illustrates integration of a spin-based thermoelectric generator within a finFET structure suitable for any logic functions of an IC, other transistor structures may be similarly integrated with a spin-Seebeck insulator providing electrical isolation to the transistor. Other transistors, such a power transistors, which may generate even larger thermal loads, may also benefit through integration of a spin-based thermoelectric generator. Typical power transistors are configured to handle higher power levels than logic devices. As such, power transistors may have a significantly larger footprint than that of the finFET example shown in FIG. 2B. Examples of power transistors include extended drain transistors (e.g., EDMOS) where a large VGD is dropped within the extended drain region to avoid breakdown of the gate dielectric. Power transistors may also employ a vertical drain architecture (e.g., VDMOS) for a similar reason. Power transistors may also employ a gate dielectric that is thicker than that of logic transistors. FIG. 2C is an isometric view of a multi-finned power transistor structure 202 comprising spin-Seebeck insulator 110 and SOC material 115 proximal to an extended drain, in accordance with some embodiments.

In FIG. 2C a plurality of non-planar semiconductor bodies 210 are in electrical parallel, for example to support larger drive currents that might be utilized in high voltage, high power applications. However, a power transistor may also employ a single non-planar or planar semiconductor body 210. As noted above in the context of a logic transistor, semiconductor body 210 may comprise one or more of: silicon, germanium, or group IV alloy systems, such as SiGe; group III-V systems, such as GaAs, InP, InGaAs, and the like; or group III-N systems, such as GaN. Semiconductor body 210 is coupled to a source region 207 at a first end in direct physical contact with a source contact 250. For non-planar embodiments, source metallization 250 may wrap around the non-planar semiconductor body (e.g., completely surround an axial length in a nanowire embodiment). Semiconductor body 210 further includes a drain region 209 at a second end in physical contact with a drain metallization 250. For non-planar embodiments, drain metallization 250 may wrap around the non-planar semiconductor body. Depending on the conductivity type of the transistor, source and drain regions 207, 209 may be doped either n-type (e.g., NMOS) or p-type (e.g., PMOS).

Semiconductor body 210 further includes a channel region 235 disposed between source region 207 and an extended-drain region 209. Channel region 235 is a semiconductor that may be substantially undoped (e.g., not intentionally doped), or may be lightly doped to a type complementary to the source/drain regions (e.g., p-type channel region for an NMOS FET, n-type channel region for a PMOS FET). Extended-drain region 211 is a semiconductor region doped to the same conductivity type as the source and drain regions 207, 209 (e.g., n-type for NMOS). Extended-drain region 211 is referred to as "lightly-doped" as it is doped more lightly than is drain region 209. In one exemplary Si NMOS embodiment, extended-drain region 211 is doped n-type to $10^{16}$ cm$^{-3}$-$10^{20}$ cm$^{-3}$. Extended-drain 211 accordingly increases the spacing between channel and drain regions, dropping along its lateral length (e.g., x-dimension) the electric field resulting from a voltage differential between voltage potential $V_g$ of gate electrode 273 and voltage potential $V_d$ of drain region 209. In the exemplary embodiment, a shape of the electric field within extended-drain 211 can be modulated by the field effect through field plate dielectric 230 as a function of voltage potential $V_{fp}$ of field plate electrode 232. As shown, each of $V_g$, $V_s$, $V_d$, and $V_{fp}$ may be configured for independent biasing during operation of transistor structure 207. In further embodiments, transistor structure 207 may be modified to directly connect field plate electrode 232 to another terminal of the device (e.g., gate electrode 273) so that field plate electrode 232 does not necessarily increase interconnect terminal count for the device.

Field plate electrode 232 is over at least a portion of extended-drain region 211 and is electrically isolated from underlying semiconductor by field plate dielectric 230. Field plate electrode 232 is further electrically isolated from gate electrode 273 by at least dielectric spacer 271, and depending on the fabrication techniques employed, may be further isolated by gate dielectric 245, as is illustrated in FIG. 2C. Field plate dielectric 230 may have a different EOT than gate dielectric 245 to tune electric field shape within extended-drain region 211 proximate to the drain edge of gate electrode 150. In the specific embodiment illustrated, a dummy gate electrode 274 is over extended-drain region 211 between gate electrode 273 and drain contact 250. Dummy gate electrode 274 may be of the same composition as gate electrode 273 and is separated from semiconductor body 210 by a dummy gate dielectric 245. Being positioned over extended-drain region 211, dummy gate bias voltage $V_{dg}$ may operate as another field plate to further modulate extrinsic resistance and electric field within extended-drain 211.

As further shown in FIG. 2C, spin-Seebeck insulator 110 is below at least extended-drain region 211, and may further extend below channel region 235. Temperature gradient $\Delta T$ is present across insulator 110 as driven by heat dissipated within extended-drain region 210, and/or other locations within transistor structure 202 during transistor operation. SOC material 115 is in contact with insulator 110, for example substantially as described above in the context of transistor structure 201 (FIGS. 2A and 2B). Circuit 152 may therefore be biased to some non-zero voltage routed by terminals 141, 142 through dielectric 120. Fabrication of transistor structure 202, at least with respect to the spin-Seebeck material stack, may proceed according to any of the techniques described above for transistor structure 201. Other features of transistor structure 202 may be fabricated according to known transistor fabrication techniques.

In some embodiments, a spin-Seebeck thermoelectric material stack is adjacent to a sidewall of a transistor semiconductor body. For such embodiments, the spin-Seebeck insulator may be further employed as a growth mask defining where an epitaxial growth of device semiconductor is to occur. Alternatively, the spin-Seebeck insulator may be deposited on and/or around a sidewall of a previously patterned semiconductor body.

Figure 2D:
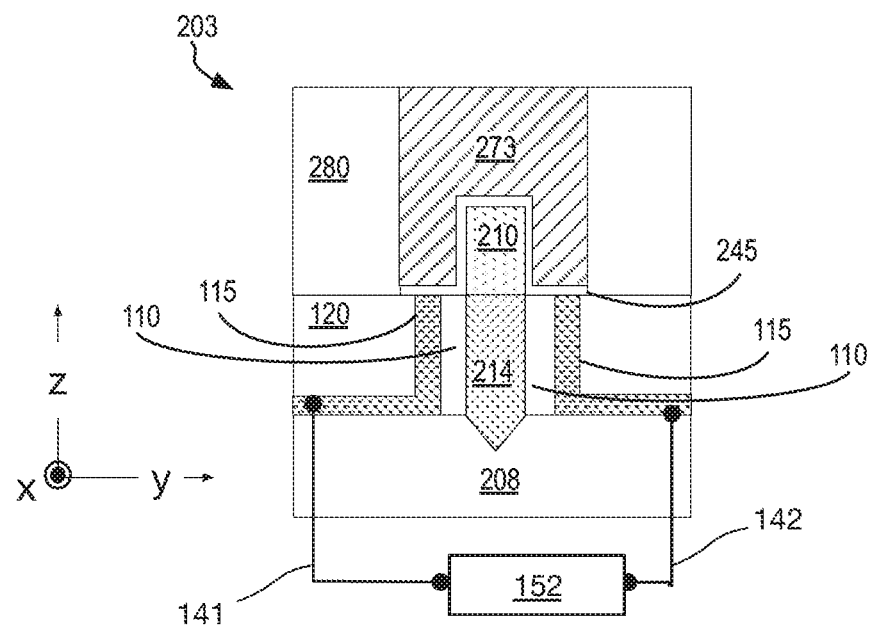
FIG. 2D is a cross-sectional profile of a finFET structure including an integral thermoelectric generator comprising a spin-Seebeck insulator and a spin orbit coupling material adjacent to a sidewall of a sub-fin portion of a semiconductor body, in accordance with some embodiments.

FIG. 2D is a cross-sectional profile of a finFET structure 203 including an integral thermoelectric generator comprising a spin-Seebeck insulator and a SOC material adjacent to a sidewall of a sub-fin portion of a semiconductor body, in accordance with some embodiments. The profile shown in FIG. 2D is on a plane orthogonal to that shown in FIG. 2B. However, finFET structure 203 may have substantially the same transistor architecture illustrated in the plan view of FIG. 2A. Reference numbers employed in FIGS. 2A and 2B are also employed in FIG. 2D where the structural features are the same.

In FIG. 2D, finFET structure 203 again includes a gate stack comprising gate dielectric 245 and gate electrode 273. The gate stack is adjacent to a sidewall of semiconductor body 210. In this particular example, semiconductor body 210 is an upper portion of a semiconductor fin structure that further comprises a lower portion, or "sub-fin" 214. Sub-fin 214 may comprise the same majority lattice constituents as semiconductor body 210 (e.g., both are Si, both are SiGe, etc.), or sub-fin 214 may be a second crystalline material (e.g., a second semiconductor material) that forms a heterojunction with semiconductor body 210. In some heterostructure examples, semiconductor body 210 is a crystalline group IV material (e.g., Si, Ge, or SiGe), while sub-fin 214 is a crystalline group III-V material (e.g. GaAs, InP, InGaAs, InSb, etc.). In other examples, semiconductor body 210 is a first crystalline group IV material (e.g., Si, Ge, or SiGe), while sub-fin 214 is a different crystalline group IV material (e.g. SiGe, Si, or Ge). In some other examples, semiconductor body 210 is a first crystalline group III-V material (e.g., GaAs, InP, InGaAs, InSb, etc), while sub-fin 214 is a different crystalline group III-V material (e.g. GaAs, InP, InGaAs, InSb, etc.).

Sub-fin 214 is over a substrate 208 that may also be a crystalline material. Sub-fin 214 may be epitaxial to substrate 208. In some advantageous embodiments, substrate 208 is crystalline silicon. Spin-Seebeck insulator 110 is adjacent to sub-fin 214. Hence, for these embodiments, spin-Seebeck insulator 110 is adjacent to a sidewall of at least a portion of a semiconductor fin, and isolation of the fin is, at least in part, provided by spin-Seebeck insulator 110. In the exemplary embodiment, spin-Seebeck insulator 110 is in direct contact with sub-fin 214. However, in some embodiments, particularly where spin-Seebeck insulator 110 is crystalline, an amorphous material (not depicted) may be intervening between sub-fin 214 and spin-Seebeck insulator 110. In the illustrated embodiment, SOC material 115 is in contact with a sidewall of spin-Seebeck insulator 110 and extends laterally (in x-y plane) between transistor structure 203 where a pair of terminals 141,142 may be interconnected to load circuit 152 substantially as described above. Dielectric 120 is in this embodiment a field dielectric material that is substantially planar with sub-fin 214.

Fabrication of transistor structure 203 may proceed according to a variety of techniques. As one example, spin-Seebeck insulator 110 may be deposited or epitaxially grown upon substrate 208 and patterned into a feature. SOC material 115 may then be deposited over spin-Seebeck insulator 110, and dielectric 120 deposited over insulator 110. The workpiece may then be planarized to expose a top surface of insulator 110, which is then patterned again to form the fin structure illustrated in FIG. 2D, and expose a portion of substrate 208. Sub-fin 214 may then be deposited or epitaxially grown from substrate 208. A spacer dielectric liner may be formed within the opening prior to forming sub-fin 214 for embodiments where spin-Seebeck insulator 110 has crystallinity that might interfere with epitaxial growth of subfin 214. Semiconductor body 210 may then be deposited or epitaxially grown from sub-fin 214, with the gate stack and source/drain terminals fabricated according to any known techniques.

In other examples, spin-Seebeck insulator 110 may be deposited following the formation of sub-fin 214 and/or semiconductor body 210. For example, a semiconductor material stack may be patterned into the fin structure illustrated in FIG. 2D with insulator 110 and SOC material 115 then deposited over an exposed sidewall of the fin structure. Insulator 110 and SOC material 115 may be subsequently recessed (e.g. by selective etch), and the gate stack then formed over an exposed sidewall of semiconductor body 210. For such embodiments, spin-Seebeck insulator 110 may be deposited without an significant crystallinity, or may be deposited as polycrystalline. Subsequent to deposition, one or more thermal anneals may be performed to further improve crystallinity of insulator 110, for example through solid phase epitaxy where a suitable template material is present within the transistor structure. Hence, a spin-Seebeck insulator may be enlisted in the fabrication of one or more other transistor structures, or the insulator may be formed independent of other portions of a transistor structure.

Figure 2E:
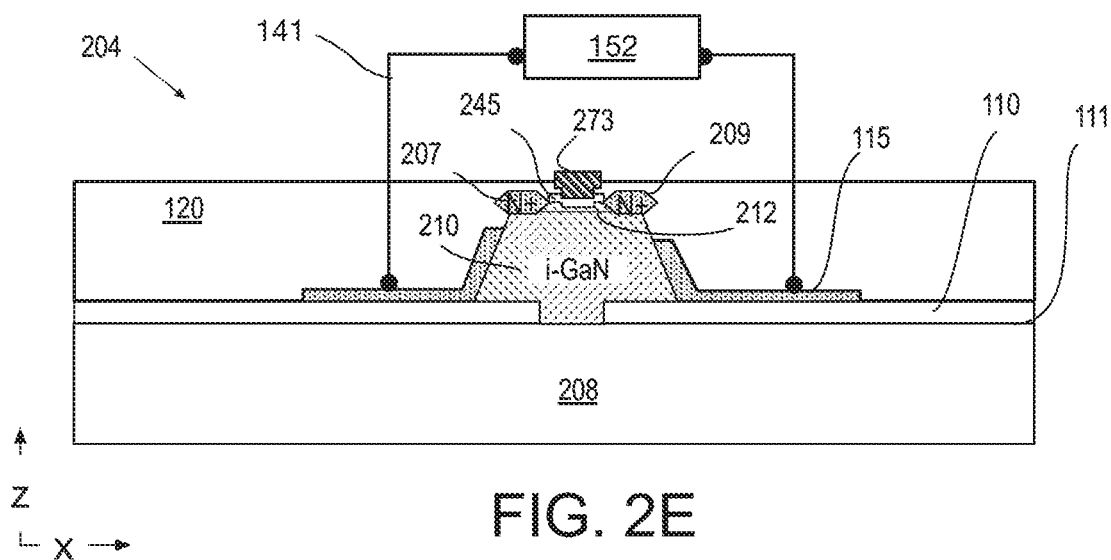
FIG. 2E is a III-N transistor structure with an integral thermoelectric generator comprising a spin-Seebeck insulator and a spin orbit coupling material, in accordance with some embodiments.

FIG. 2E illustrates another exemplary transistor structure 204 that integrates a spin-Seebeck thermoelectric generator. In transistor structure 204, semiconductor body 210 comprises a III-N material, such as, but not limited to, binary GaN, AlN, ternary AlGaN, InGaN, or quaternary AlInGaN, etc. III-N transistor structures are also suitable as high power devices, for example capable of sustaining breakdown voltages in excess of 100V. Heat may be extracted from such devices following the principles outlined above (e.g., in the context of FIG. 1A). As further shown in FIG. 2E, semiconductor body 210 extends through an opening (e.g., pinhole) in spin-Seebeck insulator 110. In some embodiments, insulator 110 may therefore serve as an epitaxial growth mask through which a mesa of III-N material is laterally overgrown beyond the opening in insulator 110 to have a portion of semiconductor body 210 in contact with insulator 110. SOC material 115 is over insulator 110, and may further extend over a portion sidewall semiconductor body 210 that is not covered by insulator 110. Dielectric material 120 may be any suitable dielectric that is over SOC material 115. Terminals electrically coupling SOC material 115 to a load circuit may be formed through dielectric material 120. In some exemplary embodiments where III-N material has the c-axis substantially orthogonal to a plane of substrate 208, transistor structure 204 may further comprise a polarization layer 212 atop semiconductor body 210. Polarization layer 212 is to have a different polarization strength than semiconductor body 210, which induces a 2D carrier gas (e.g., 2DEG) between source 207 and drain 209. Gate electrode 273 may then electrostatically control the 2DEG within the underlying channel region of the device. In MISFET embodiments, gate electrode 273 is separated from polarization layer 212 by gate dielectric 245. Alternatively, in MESFET embodiments, Schottky junction may be between gate electrode 273 and polarization layer 212.

Figure 2F:
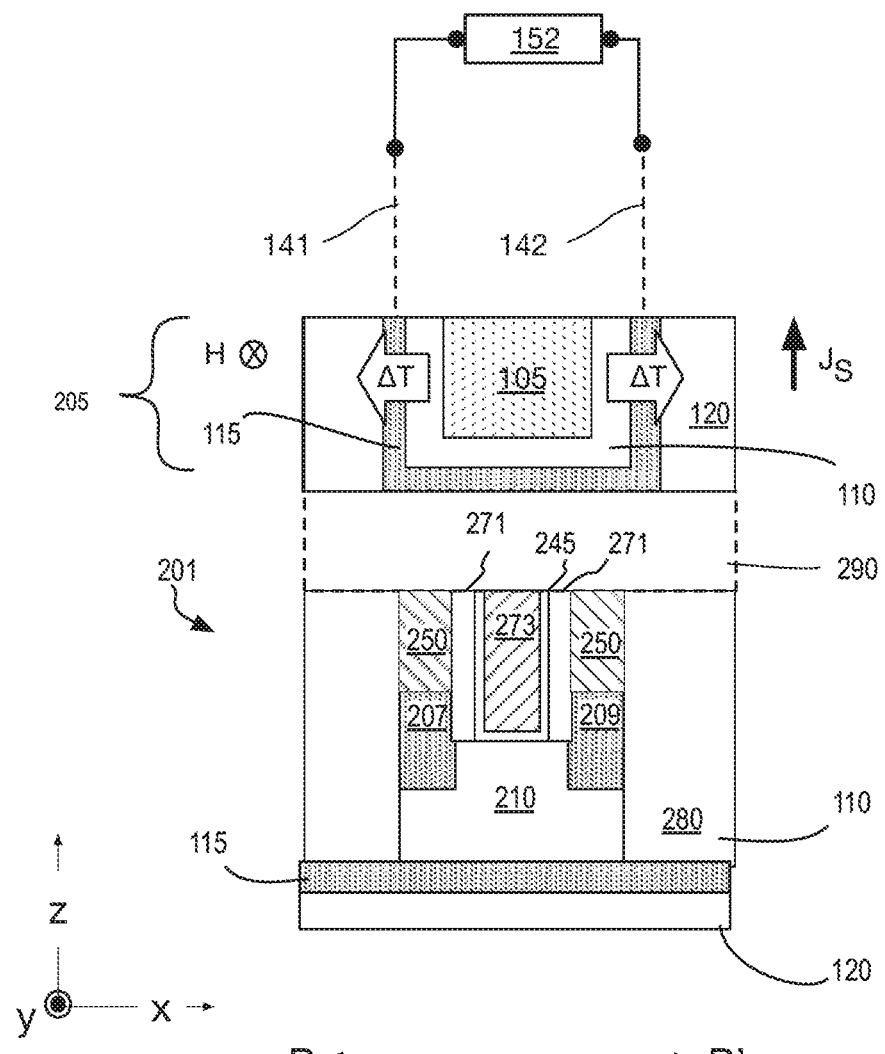
FIG. 2F is a cross-sectional profile view of an IC interconnect with an integral thermoelectric generator comprising a spin-Seebeck insulator and a spin orbit coupling material, in accordance with some embodiments.

As noted above, a spin-Seebeck thermoelectric material stack may be integrated into an IC interconnect. FIG. 2F is a profile view of an IC interconnect structure 205 comprising spin-Seebeck insulator 110 and SOC material 115, in accordance with some embodiments. IC interconnect structure 205 may be any interconnect level of an IC. One or more interlevel dielectrics (ILD) and/or interconnect metallization levels may be present within top-side stack 290. In the illustrated example, IC interconnect structure 205 is over transistor structure 201, substantially as described above, such that there are multiple spin-Seebeck thermoelectric material stacks present within a single IC.

As further shown in FIG. 2F, SOC material 115 lines a trench opening within dielectric material 120. SOC material 115 may, for example, be deposited over an underlying ILD and onto a sidewall of dielectric material 120 according to any technique suitable for depositing an interconnect liner, such as PVD or chemical vapor deposition (CVD). Spin-Seebeck insulator 110 lines a trench opening within dielectric material 120. Insulator 110 may also be deposited (e.g., by PVD or CVD) over the underlying SOC material 115, and onto a sidewall of SOC material 115. For such embodiments, spin-Seebeck insulator 110 may be polycrystalline or substantially amorphous. Electrical conductor 105 is then deposited or plated to substantially fill the remaining trench opening. For such embodiments, electrical conductor 105 may be any metal known suitable for interconnect metallization, such as, but not limited to, copper, ruthenium, cobalt, tungsten, aluminum, or nickel. Any suitable planarization process (e.g., CMP) may be performed to remove deposition overburden and expose a top surface of dielectric material 120 and arrive at the structure illustrated in FIG. 2F. In some embodiments, spin-Seebeck insulator 110 also functions as an interconnect diffusion barrier, confining constituents of conductor 105 such that the further addition of a conventional interconnect barrier layer (e.g., TaN) may be avoided. For such embodiments, fill metal (e.g., Cu, Ru, Al, etc.) is in direct contact with insulator 110. One or more additional interconnect metallization levels above or below IC interconnect structure 205 may make electrical contact with SOC material 115 and route terminals 141, 142 to load circuit 152.

Figure 3:
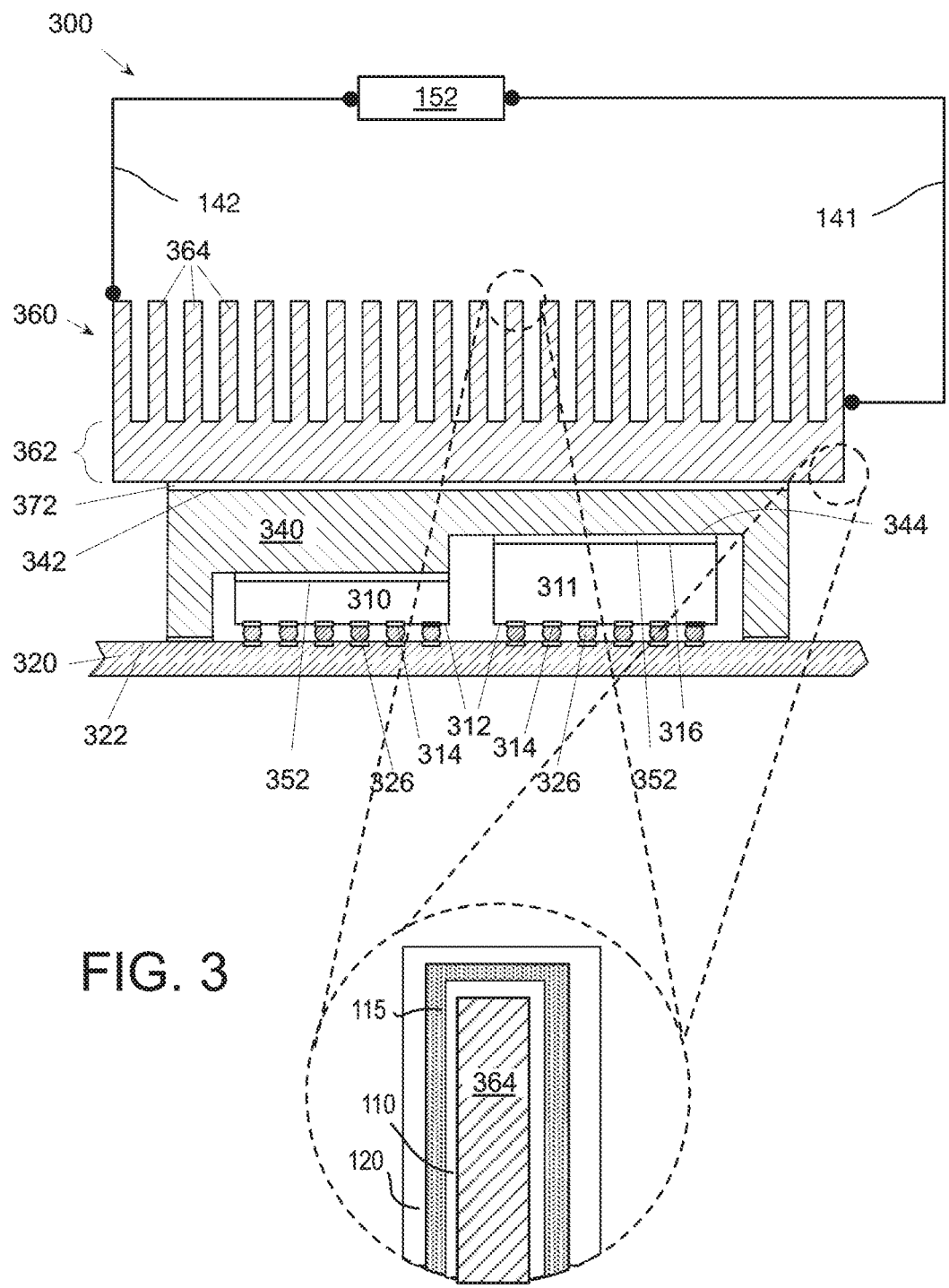
FIG. 3 is a cross-sectional view of IC system with an integral thermoelectric generator comprising a spin-Seebeck insulator and a spin orbit coupling material, in accordance with some embodiments.

In further embodiments, a thermoelectric generator comprising a spin-Seebeck insulator and a SOC material are integrated into a IC package assembly. For example, a spin-Seebeck material stack may be in contact with a cold side of a heat spreader or heat exchanger integrated within an IC package, or assembled upon an IC package. FIG. 3 is a cross-sectional view of microelectronic system 300 that includes a thermoelectric generator comprising spin-Seebeck insulator 110 and SOC material 115, in accordance with some embodiments.

As shown in FIG. 3, microelectronic system 300 comprises a plurality of microelectronic devices (illustrated as IC die 310 and IC die 311), such as microprocessors, chipsets, graphics devices, wireless devices, memory devices, application specific integrated circuits, combinations thereof, stacks thereof, or the like. In some specific embodiments, die 311 is a microprocessor, and die 310 is a integrated voltage supply (IVS) coupled to provide power to die 311. Die 310 and die 311 are attached to a first surface 322 of a microelectronic substrate 320 (e.g., a printed circuit board, a motherboard, and the like) through a plurality of interconnects 326 (e.g., reflowable solder bumps or balls). Device-to-substrate interconnects 326 may extend between bond pads 314 on an active surface 312 of each of microelectronic devices 110 and 111 and bond pads 314. Device-to-substrate interconnects 326 can be made of any appropriate material, including, but not limited to, solder materials.

An integrated heat spreader 340 is thermally coupled with microelectronic devices 310 and 311. Integrated heat spreader 340 may be made of any appropriate thermally conductive material, such a metals and alloys, including, but not limited to, copper, aluminum, and the like. Integrated heat spreader 340 may have a first (cool) surface 342 and an opposing second (hot) surface 344. A thermal interface material 352, such as a thermally conductive grease or polymer, may be disposed between integrated heat spreader 340 and a respective back surface 316 of microelectronic devices 110 and 111 to facilitate heat transfer. As further illustrated in FIG. 3, integrated heat spreader 340 may be in contact with heat exchanger/dissipation structure 360, which may comprise a conductive base plate 362 on a first (hot) side, and a plurality of fins or projections 364 extending therefrom, wherein projections 364 provide a second (cool) side with a high surface area. A thermal interface material 372, such as a thermally conductive grease or polymer, may be disposed between integrated heat spreader 340 and dissipation structure 360 to facilitate heat transfer. A spin-Seebeck material stack may be formed onto one or more of an integrated heat spreader or heat dissipation structure. As still further illustrated in FIG. 3 for example, a spin-Seebeck material stack is on a surface of dissipation structure 360. In some embodiments, spin-Seebeck insulator 110 is over, or directly on, an exterior sidewall of heat dissipation structure 360. SOC material 115 is on insulator 110 and dielectric 120 encapsulates the spin-Seebeck material stack. Terminals 141, 142 electrically couple the spin-Seebeck material stack to load circuit 152. As further shown in the expanded view, the spin-Seebeck material stack may be over, or directly on, each of the fins of heat dissipation structure 360. In some specific examples where IC chip 310 is an IVS further comprising a voltage regulator, chip 310 comprises the load circuit coupled to terminals 141 and 142 so that energy extracted from heat dissipation structure 360 may be fed back into system 300. In some further examples, energy extracted from heat dissipation structure 360 is coupled to power a fan or other component of system 300.

Figure 4A:
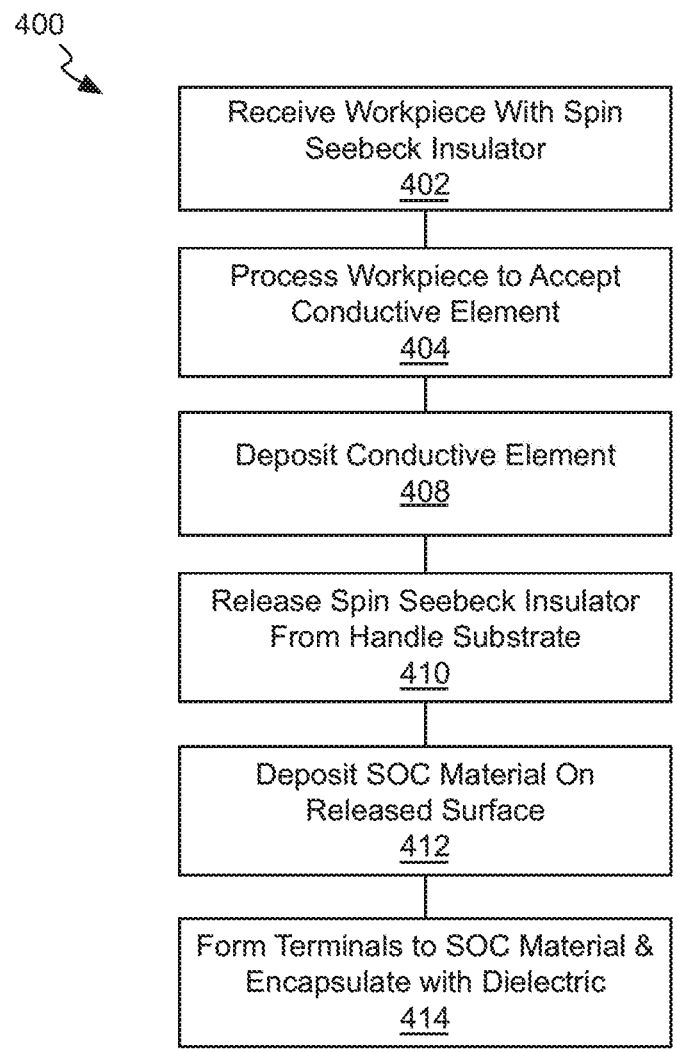
FIG. 4A, 4B, 4C are flow diagrams of methods of fabricating devices with an integral thermoelectric generator comprising a spin-Seebeck insulator and a spin orbit coupling material, in accordance with some embodiments.
Figure 4B:
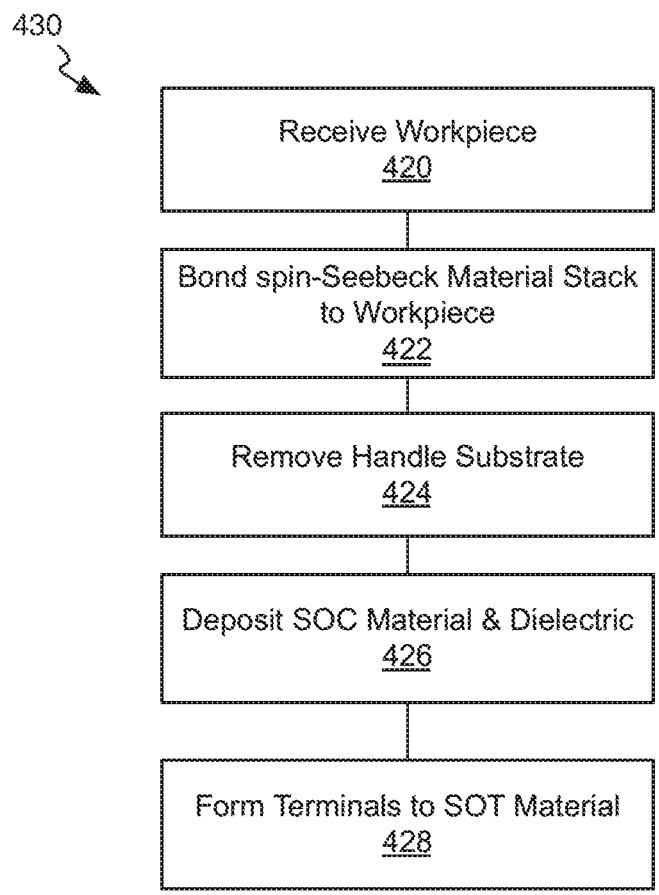
Figure 4C:
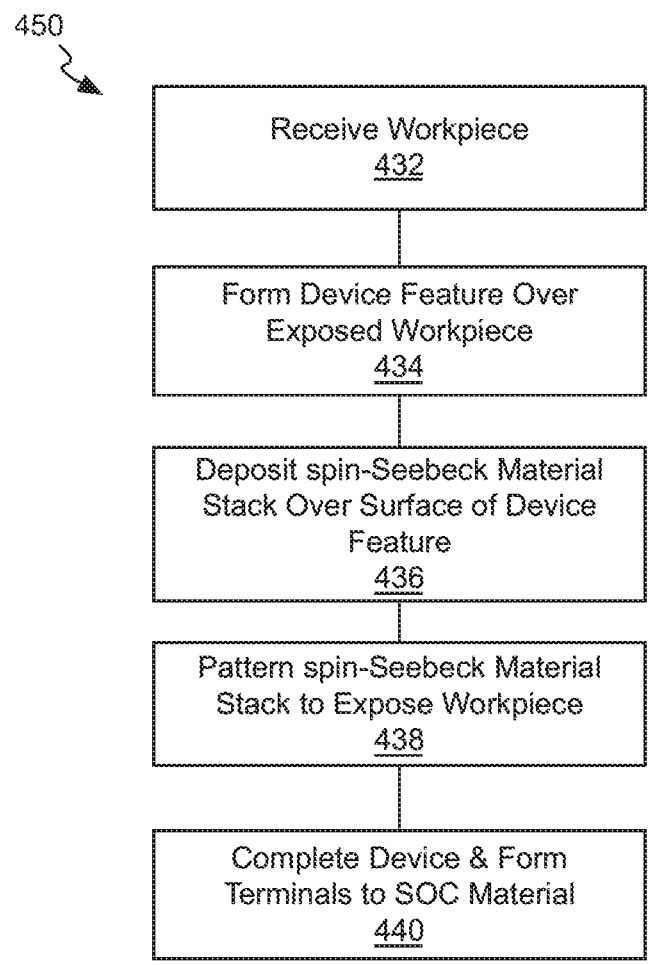

The device structures described in the examples above may be fabricated according to a variety of methods and techniques. FIGS. 4A, 4B and 4C are flow diagrams of methods 400, 430, and 450, respectively, for fabricating devices with an integral thermoelectric generator comprising a spin-Seebeck insulator and a spin coupling material, in accordance with some embodiments.

Referring first to FIG. 4A, methods 400 begin with receiving a workpiece at block 402. For such embodiments, the workpiece may be known to be suitable for forming spin-Seebeck material stacks. For example, the workpiece may comprise a crystalline handle substrate known to be suitable as a seed crystal for epitaxial growth of a desired crystalline spin-Seebeck insulator. The spin-Seebeck insulator may then be grown, for example with liquid phase epitaxy, or other technique known to be suitable for the insulator. Alternatively, such epitaxial growth is performed upstream of methods 400 such that the workpiece received at block 402 includes both the spin-Seebeck insulator and a handle substrate.

Methods 400 continue at block 404 where the workpiece is processed to accept a conductive element. Patterning processes (e.g., photolithography and wet or dry etching) may be performed at block 404, for example, to define trenches within the spin-Seebeck insulator. At block 408, a conductive element is deposited, for example by PVD, CVD or a plating process, into the features patterned in the spin-Seebeck insulator. At block 410, the spin-Seebeck insulator is released from the host handle substrate. In some embodiments where the spin-Seebeck insulator includes a bulk portion sufficient to maintain mechanical integrity, there need not be any transfer handle substrate. Alternatively, any suitable layer transfer process may be employed, for example to bond a top side of the conductive element and spin-Seebeck insulator (opposite the host handle substrate) to a transfer handle substrate. With a second side of the spin-Seebeck insulator exposed upon release from the host substrate, at block 412 a SOC material is deposited onto the released surface of the spin-Seebeck insulator. Any of the spin coupling materials described above may be deposited by any suitable technique, such as, but not limited to PVD and CVD. At block 414, terminals are formed to the SOC material and the spin-coupling material is encapsulated in a dielectric, for example, with any suitable mold casting process.

Referring next to FIG. 4B, methods 430 begin with receiving a workpiece at block 420. For such embodiments, the workpiece may be any known to be suitable for semiconductor device manufacture, such as, but not limited to material wafers or panels. In some embodiments, the workpiece received at block 420 includes one or more IC components (e.g., transistors and/or interconnect metallization levels). At operation 422, a spin-Seebeck insulator is bonded to a surface of the workpiece, for example by any suitable layer transfer process. At block 424, a host handle substrate is removed, leaving the spin-Seebeck insulator supported by only the workpiece received at block 420. At block 426, an SOC material and a dielectric material are deposited over the spin-Seebeck insulator to complete fabrication of the stack. Terminals to the SOC material are then fabricated at block 428.

In reference to FIG. 4C, methods 450 begin at block 432 where a workpiece is received. For such embodiments, the workpiece may be any known to be suitable for semiconductor device manufacture, such as, but not limited to material wafers or panels. At block 434, one or more active device features are fabricated into the workpiece. For example, a semiconductor body, such as a fin structure, may be defined into the workpiece. At block 436 a spin-Seebeck insulator is deposited as a thin film upon exposed surfaces of the features. For example, a spin-Seebeck insulator may be deposited by PVD upon a sidewall of a semiconductor fin. An SOC material may then be further deposited upon the insulator to complete the spin-Seebeck material stack. Methods 450 continue at operation 438 where the spin-Seebeck material stack is patterned, exposing various portions of the workpiece. Methods 450 then complete at block 440 where any additional features of the device structure and interconnect structures (e.g., terminals to the spin coupling material) are fabricated according to any suitable techniques.

Alternatively, the workpiece received at block 432 may be any wire or cable known to be suitable as a power connector. At block 436, a spin-Seebeck insulator is deposited as a thin film upon exposed surfaces of the cable or wire. The SOC material may then be further deposited upon the insulator to complete the spin-Seebeck material stack. Methods 450 then complete at block 440 where the workpiece is then encapsulation in a dielectric and terminals to the spin coupling material are fabricated according to any suitable techniques.

Figure 5:
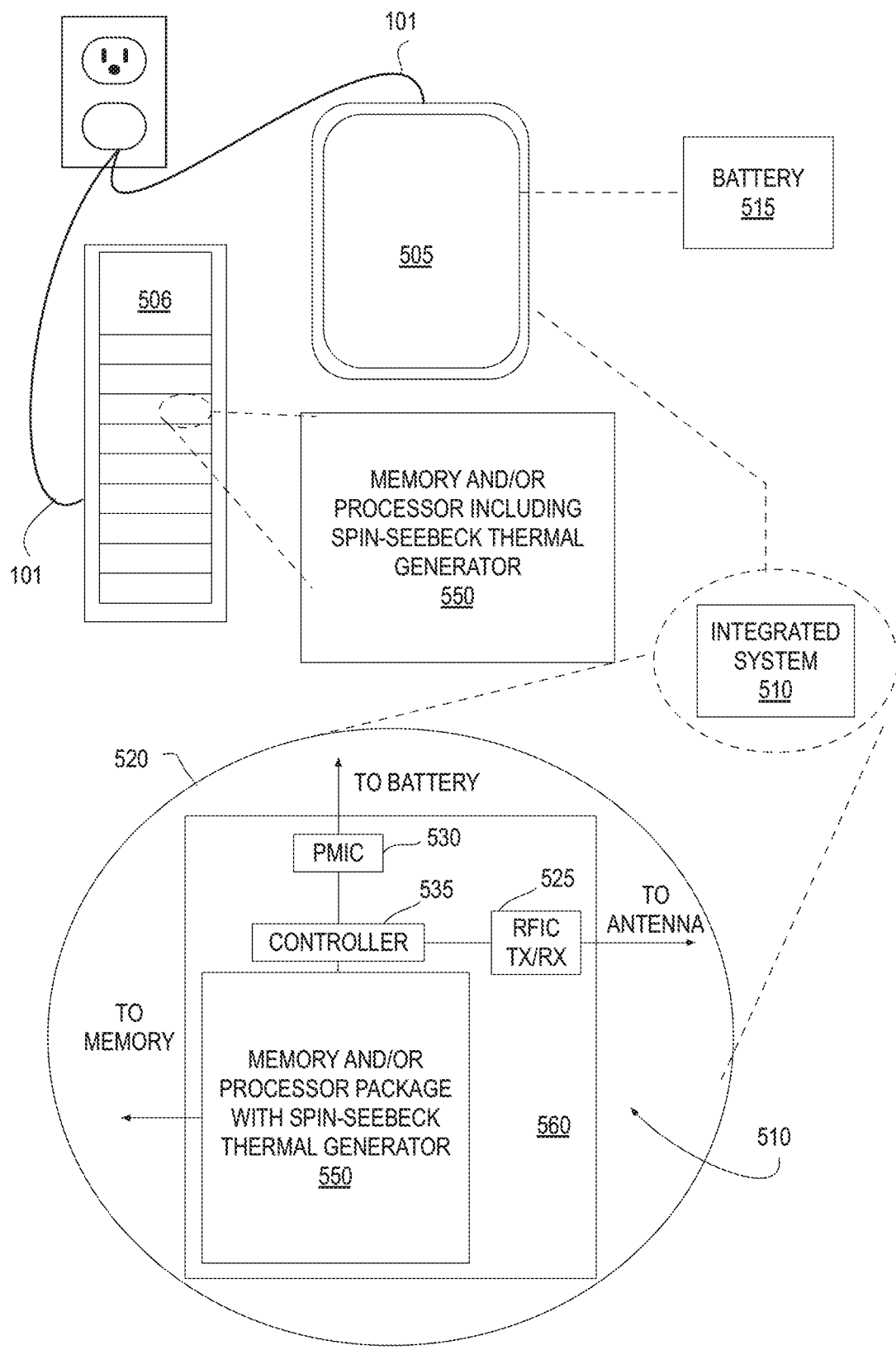
FIG. 5 illustrates infrastructure and mobile computing device platforms, in accordance with some embodiments.

FIG. 5 illustrates a system in which a mobile computing platform 505 and/or a data server machine 506 is powered through a power connector 101, in accordance with one or more embodiment of the present invention. The server machine 506 may be any commercial server, for example including any number of high-performance computing platforms disposed within a rack and networked together for electronic data processing, which in the exemplary embodiment includes a packaged IC 550. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515. Power connector 101 may include a thermoelectric generator, for example as describe elsewhere herein.

Whether disposed within the integrated system 510 illustrated in the expanded view 520, or as a stand-alone packaged chip within the server machine 506, packaged IC 550 includes a memory chip (e.g., RAM), or a processor chip (e.g., a microprocessor, a multi-core microprocessor, graphics processor, or the like) at least one of which may be integrated with a thermoelectric generator, for example as describe elsewhere herein. IC 550 may be further coupled to a board, a substrate, or integrated into a system-on-chip (SoC) 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller 535.

Functionally, PMIC 530 may perform battery power regulation, DC-to-DC conversion, etc., and so has an input coupled to battery 515 and with an output providing a current supply coupled to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the IC 550 or within a single IC coupled to the package substrate of the IC 550. In particular embodiments, at least one of a processor IC, memory IC, RFIC, or PMIC includes circuitry that incorporates a spin-based thermoelectric generator, for example having one or more of the structural features described elsewhere herein.

Figure 6:
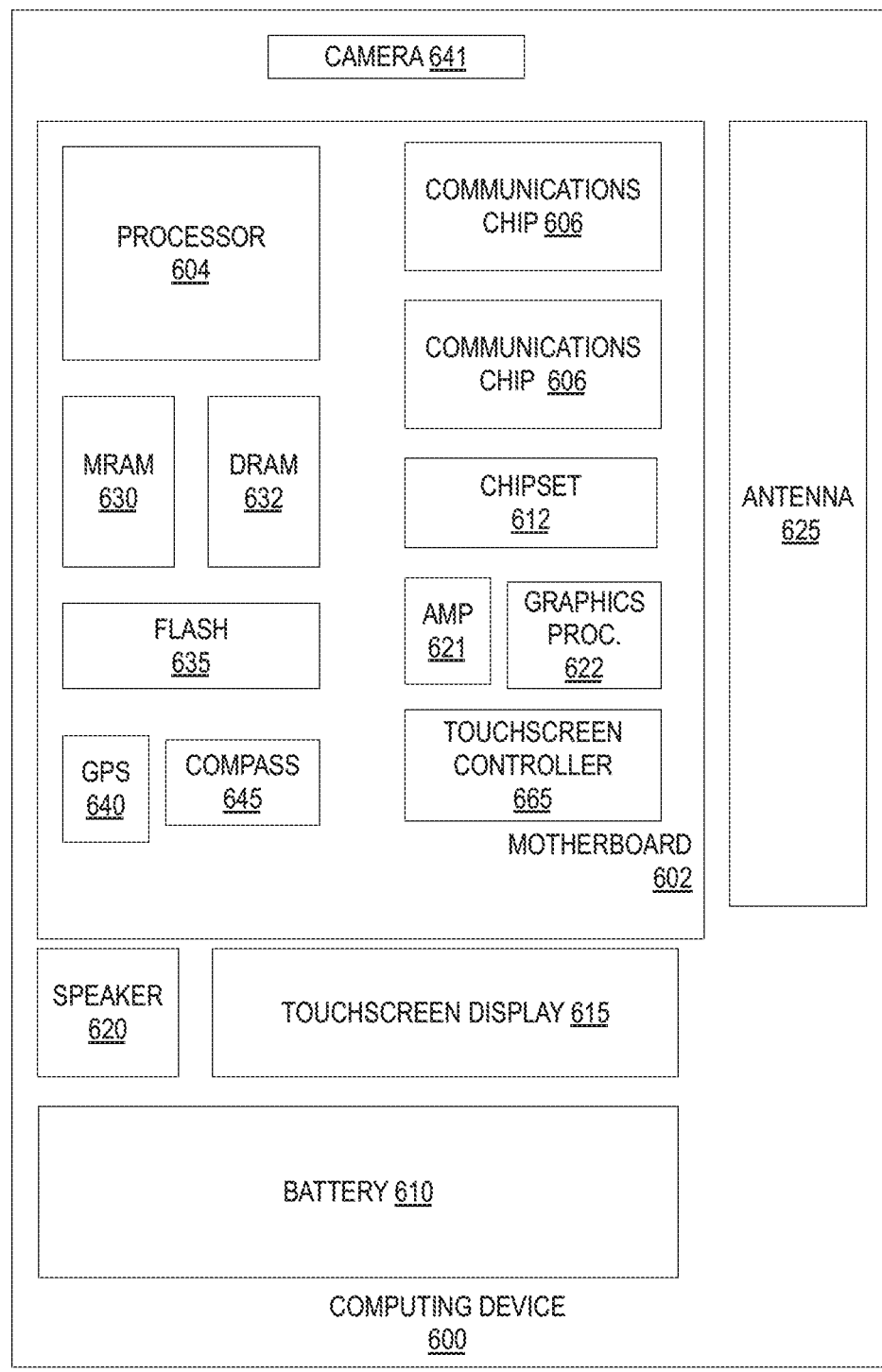
FIG. 6 illustrates a computing device platform, in accordance with some embodiments.

FIG. 6 illustrates a computing device 600 in accordance with embodiments of the present disclosure. In various implementations, computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

As shown, computing device 600 houses a motherboard 602. Motherboard 602 may include a number of components, including but not limited to a processor 604 and at least one communication chip 606. Processor 604 is physically and electrically coupled to the motherboard 602. In some implementations, communication chip 606 is also physically and electrically coupled to motherboard 602. In further implementations, communication chip 606 is part of processor 604. In some embodiments, at least one of processor 604 and communication chip 606 comprises a spin-based thermoelectric generator, for example as described elsewhere herein.

Depending on its applications, computing device 600 may include other components that may or may not be physically and electrically coupled to motherboard 602. These other components include, but are not limited to, volatile memory (e.g., DRAM 632), non-volatile memory (e.g., MRAM 630), or flash memory 635. Computing device 600 may further include one or more of a graphics processor 622, a digital signal processor, a crypto processor, a chipset 612, an antenna 625, a display 615, a battery 610, an audio codec, a video codec, a power amplifier 621, a global positioning system (GPS) device 640, a compass 645, an accelerometer, a gyroscope, a speaker 620, a camera 641, and a mass storage device (such as hard disk drive, compact disk (CD), digital versatile disk (DVD), or the like.

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.11 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of the computing device 600 includes an integrated circuit die packaged within processor 604. In some embodiments, the integrated circuit die of processor 604 or packaged processor includes a thermoelectric generator, for example as described elsewhere herein. The term "processor" may refer to any device or portion of a device that processes electronic data from registers and/or memory to transform that electronic data into other electronic data that may be stored in registers and/or memory.

The following examples further illustrate how various features described above may be integrated into a device, system, or platform.

In first examples, a microelectronic device comprises a transistor comprising a non-planar semiconductor body, a source and drain coupled to a channel portion of the semiconductor body, and a gate stack adjacent to at least a sidewall of the semiconductor body, the gate stack comprising a gate electrode and a gate dielectric that is between the gate electrode and the semiconductor body. The device further comprises a spin orbit coupling (SOC) material comprising a metal, the SOC material electrically insulated from the semiconductor body and gate electrode by a spin-Seebeck insulator, wherein the insulator has remanent magnetization. The device further comprises a load circuit coupled to the SOC material through a pair of terminals, the electrical circuit to be powered, at least in part, by a voltage across the pair of terminals, wherein the voltage is a function of a temperature variation across the insulator.

In second examples, for any of the first examples the SOC material comprises at least one material layer comprising β-Tantalum, β-Tungsten, Pt, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

In third examples, for any of the first examples the insulator comprises a ferromagnetic or ferromagnetic material.

In fourth examples, for any of the third examples the insulator is single crystalline or polycrystalline.

In fifth examples, for any of the third or fourth examples the insulator comprises at least one layer of yttrium-iron garnet, thulium-iron garnet, LaSrFeMnO, $F_2O_3$, $Fe_3O_4$, or LaYFeO.

In sixth examples, for any of the first through fifth examples the gate stack is over a top surface of the semiconductor body, and the insulator is in direct contact with at least one of a sidewall or bottom surface of at least a portion of the semiconductor body.

In seventh examples, for any of the first through the sixth examples the semiconductor body comprises an extended drain region between the channel portion and the drain, and the insulator is in direct contact with a bottom surface of semiconductor material below the extended drain region.

In eighth examples, for any of the first through seventh examples the channel portion of the semiconductor body comprises a group III-V compound or III-N material.

In ninth examples, for any of the first through the eighth examples the device further comprises a conductive feature of an interconnect metallization level over the transistor, and coupled to the source, wherein the SOC material and the insulator clad the conductive feature.

In tenth examples, for any of the ninth examples the SOC material is lining a trench in a dielectric material, the conductive feature is within the trench, with the insulator therebetween, wherein the insulator is in direct contact with a sidewall and a bottom surface of the conductive feature.

In eleventh examples, a microelectronic device assembly comprises a package substrate, one or more integrated circuit (IC) chips attached to the package substrate, a heat spreader attached to a side of the IC chips opposite the package substrate, and a spin orbit coupling (SOC) material comprising a metal. The SOC material is electrically insulated from the heat sink by a spin-Seebeck insulator. The insulator has remanent magnetization, and the device assembly further comprises a load circuit coupled to the SOC material through a pair of terminals, the load circuit to be powered, at least in part, by a voltage across the pair of terminals, wherein the voltage is a function of a temperature variation across the insulator.

In twelfth examples, for any of the eleventh examples, the IC chips comprise a processor chip, and the insulator is bonded to an exterior surface of the heat spreader.

In thirteenth examples, for any of the eleventh through twelfth examples the IC chips further comprise a voltage regulator chip, and the voltage regulator chip comprises the electric circuit.

In fourteenth examples, for any of the eleventh through thirteenth examples, the device further comprises a power supply coupled to one or more of the IC chips.

In fifteenth examples, a method of fabricating a microelectronic device comprises forming, on a workpiece, a non-planar body comprising a semiconductor. The method comprises depositing a spin-Seebeck insulator over a sidewall of the non-planar body and depositing a spin orbit coupling (SOC) material over the insulator. The method comprises depositing a dielectric material over the spin orbit coupling material, and forming a pair of terminals to the SOC material. The method comprises connecting the pair of terminals as a voltage source to a load circuit.

In sixteenth examples, for any of the fifteenth examples the depositing comprises physical vapor deposition (PVD) of a polycrystalline ferromagnetic or ferromagnetic material.

In seventeenth examples, for any of the sixteenth examples the polycrystalline ferromagnetic or ferromagnetic material comprises at least one of yttrium-iron garnet, thulium-iron garnet, LaSrFeMnO, $F_2O_3$, $Fe_3O_4$, or LaYFeO.

In eighteenth examples for any of the fifteenth through seventeenth examples depositing the SOC material comprises physical vapor deposition (PVD) of at least one material layer comprising β-Tantalum, β-Tungsten, Pt, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

In nineteenth examples, for any of the fifteenth through eighteenth examples the method comprises depositing at least one of the insulator and the SOC material over a sidewall of the non-planar body.

In twentieth examples, for any of the fifteenth through nineteenth examples the method comprises forming a source and drain coupled to the non-planar body, and forming a gate stack between the source and drain, the gate stack comprising a gate electrode and a gate dielectric.

It will be recognized that principles of the disclosure are not limited to the embodiments so described, but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A microelectronic device, comprising:
    a transistor comprising:
        a non-planar semiconductor body;
        a source and drain coupled to a channel portion of the semiconductor body; and
        a gate stack adjacent to at least a sidewall of the semiconductor body, the gate stack comprising a gate electrode and a gate dielectric between the gate electrode and the semiconductor body;
    a spin orbit coupling (SOC) material comprising a metal, the SOC material separated from the semiconductor body and the gate electrode by a spin-Seebeck insulator, wherein the insulator comprises remanent magnetization; and
    a load circuit coupled to the SOC material through a pair of terminals, the load circuit to be powered, at least in part, by a voltage across the pair of terminals, wherein the voltage is a function of a temperature variation across the insulator.

2. The microelectronic device of claim 1, wherein the SOC material comprises at least one of β-Tantalum, β-Tungsten, Pt, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

3. The microelectronic device of claim 2, wherein the insulator comprises a ferromagnetic material.

4. The microelectronic device of claim 3, wherein the insulator is single crystalline or polycrystalline.

5. The microelectronic device of claim 3, wherein the insulator comprises at least one of yttrium-iron garnet, thulium-iron garnet, LaSrFeMnO, $F_2O_3$, $Fe_3O_4$, or LaYFeO.

6. The microelectronic device of claim 1, wherein:
    the gate stack is over a top surface of the semiconductor body; and
    the insulator is in direct contact with at least one of a sidewall or bottom surface of at least a portion of the semiconductor body.

7. The microelectronic device of claim 1, wherein the semiconductor body comprises an extended drain region between the channel portion and the drain; and the insulator is in direct contact with a bottom surface of semiconductor material below the extended drain region.

8. The microelectronic device of claim 1, wherein the channel portion of the semiconductor body comprises a group III-V compound.

9. The microelectronic device of claim 1, further comprising a conductive feature of an interconnect metallization level over the transistor, and coupled to the source, wherein the SOC material and the insulator clad the conductive feature.

10. The microelectronic device of claim 9, wherein the SOC material is lining a trench in a dielectric material, the conductive feature is within the trench, with the insulator therebetween, wherein the insulator is in direct contact with a sidewall and a bottom surface of the conductive feature.

* * * * *